United States Patent
Ronte et al.

(10) Patent No.: US 8,886,486 B2
(45) Date of Patent: Nov. 11, 2014

(54) DEVICE AND METHOD FOR TESTING APD MEASURING DEVICE

(75) Inventors: Sunao Ronte, Atsugi (JP); Satoru Arakawa, Atsugi (JP)

(73) Assignee: Anritsu Corporation, Atsugi-Shi (JP)

( * ) Notice: Subject to any disclaimer, the term of this patent is extended or adjusted under 35 U.S.C. 154(b) by 489 days.

(21) Appl. No.: 13/313,303

(22) Filed: Dec. 7, 2011

(65) Prior Publication Data
US 2012/0310583 A1    Dec. 6, 2012

(30) Foreign Application Priority Data
Mar. 29, 2011 (JP) ................................. 2011-072675

(51) Int. Cl.
*G01C 25/00* (2006.01)
*G01R 23/16* (2006.01)
*G01R 35/00* (2006.01)

(52) U.S. Cl.
CPC ................ *G01R 23/16* (2013.01); *G01R 35/00* (2013.01)

USPC ........................................................ 702/116

(58) Field of Classification Search
CPC .......... G01R 23/16; G01R 35/00; G05B 9/02; G01D 3/08; G01F 25/007; G01N 27/4165; G06K 9/6288
See application file for complete search history.

(56) References Cited

U.S. PATENT DOCUMENTS 4,539,518 A * 9/1985 Kitayoshi ................... 324/76.21
2010/0246653 A1* 9/2010 Ronte et al. .................... 375/224

FOREIGN PATENT DOCUMENTS

JP         2008275401 A    11/2008

* cited by examiner

*Primary Examiner* — Elias Desta
(74) *Attorney, Agent, or Firm* — Pearne & Gordon LLP (57) ABSTRACT

To accurately test the operating state of the APD measuring device. A test device 40 includes a test signal generator 41 that generates a test signal corresponding to the center frequency of a signal to be measured and a control unit 42 that variably controls the amplitude level of a test signal in the dynamic range of an APD measuring device 1 at random, in order to test the operating state of the APD measuring device 1.

15 Claims, 5 Drawing Sheets

DEVICE AND METHOD FOR TESTING APD MEASURING DEVICE

TECHNICAL FIELD

The present invention relates to a test device and method for testing whether an APD measuring device which analyzes frequency band components of a signal and measures the probability (which is called an amplitude probability distribution or simply called a hour rate and is hereinafter referred to as APD (Amplitude Probability Distribution)) of the magnitude of each frequency band component exceeding a predetermined threshold value for a predetermined period of time is operating normally.

BACKGROUND ART

The measurement of the APD is one of the methods of acquiring statistical data for calculating the time probability of a received signal with an amplitude greater than a predetermined level, and through statistically observing the received signal, signal characteristics which cannot be instantaneously seen may be observed.

For example, an APD measuring device has been proposed in which an analog-digital converter (hereinafter, simply referred to as an "A/D converter") converts a received signal into digital data, a filter bank allocates the output of the A/D converter to a plurality of frequency band components, weights the amplitudes of each frequency band component with a desired amount and combines the amplitudes, and a weighted APD receives the output of the filter bank, calculates probability on the basis of the frequency of occurrence of the combined amplitude, and displays the calculated probability on a display unit in various ways (for example, see Patent Document 1).

When the band of the signal to be measured by the APD measuring device is wide, in order to minutely observe the behavior of a temporal signal, it is necessary to sample the signal at a speed that is equal to or greater than twice the highest frequency in the band and observe the signal. In addition, in order to measure the APD of the band, it is necessary to sample the signal at a speed that is equal to or greater than ten times the highest frequency and observe the signal. For example, when the band to be measured is 10 MHz, it is necessary to sample and observe data at a speed that is ten times more than the band, that is, at a speed of 100 M/sec (=10 M×10).

When the APD of the extended data is measured, it is necessary to store and accumulate data using a real-time process. In order to simplify the real-time process, the APD measuring device according to the related art quantizes sampled data with accuracy which does not cause a practical problem, accumulates the frequency of appearance for a predetermined period of time (for example, 1 second), and creates probability density function (PDF) data.

Since the PDF data is generated at a predetermined time interval (for example, at a time interval of 1 second), a process of creating APD statistical data, which is a distribution function obtained by cumulatively adding the PDF data, does not need to be performed in real time, but can be performed at a predetermined time interval. The process can be performed by software processing capable of easily processing a complicated process such as a display process or signal processing that is difficult to implement in hardware.

Software processing has a processing speed lower than hardware, but is advantageous in manufacturing costs and future technical succession. The use of software processing together with hardware processing is an effective means to realize a more complicated process such as a control process or the like including a determiner.

As such, the APD measuring device according to the related art measures the APD using two processes, that is, a real-time process and a non-real-time process. The real-time process is performed by hardware and the non-real-time process is performed by software.

In the hardware, a received signal is separated into an in-phase (hereinafter, simply referred to as "I") component and a quadrature-phase (hereinafter, simply referred to as "Q") component, an envelope is detected, and logarithmic conversion is performed.

When a signal level is counted at an interval of 0.1 dB, 1000 counters are prepared, and a signal history is accumulated at an interval of 0.1 dB in a dynamic range of 100 dB. Similarly, when the signal level is counted at an interval of 0.05 dB, 2000 counters are prepared and a signal history is accumulated at an interval of 0.05 dB in a dynamic range of 100 dB.

The counters need to be prepared for each frequency band component. For example, when it is assumed that the sampling period is 100 M/s and the quantized levels of the counters are 1000 stages, a maximum count value of 100 M×1000 is transmitted from hardware to the software processing side for one second. An integer value up to 100 M can be represented by 28 bits. Therefore, in this example, the count value for each frequency band component is transmitted at a rate of 28×1000=28 kb/s. When time-series data is transmitted after envelope detection, the count value is transmitted at a rate of 100 M/s×16 bits (16 bits per sample) for 1 second and a transmission rate of 1.6 Gb/s is needed.

RELATED ART DOCUMENT

Patent Document

[Patent Document 1] JP-A-2008-275401

DISCLOSURE OF THE INVENTION

Problem that the Invention is to Solve

As such, since the APD measurement is a measuring method ensuring the time capture rate of the signal, a test method related to multi-channel APD measurement for ensuring a signal capture rate of 99% or more on the time axis [standard: cispr16-1-1 3rd ed. "Specification for Radio Disturbance and Immunity Measuring Apparatus and Methods" (2010)] is an important problem.

However, the test method according to the related art tests the amplitude whose time occurrence frequency is determined in order to investigate loss in a given time range. For example, in the test method, a continuous change is made by a ramp function to test amplitude linearity. However, these are simple methods for investigating a single channel, but have low reliability as a method of investigating the linearity or signal capture rate of a dynamic APD circuit. Therefore, it is difficult for the methods to accurately test the operating state of the APD measuring device.

The behavior of the APD is to measure a random variation in the time axis, and the method according to the related art is insufficient to measure the random behavior. The reason is as follows. Even when a DC-level low frequency wave is turned on or off or the same ramp function is given, this is the response of a low frequency component of the test signal to an APD forming circuit, but is not a test method capable of anticipating a response to the operation of random behavior.

The invention has been made in view of the above-mentioned problems and an object of the invention is to provide an APD measuring device test device and method for testing capable of testing the operating state of an APD measuring device with high accuracy.

Means for Solving Problem

In order to achieve the object, according to a first aspect of the invention, there is a provided a device 40 for testing an APD measuring device 1 that analyzes frequency band components of a signal to be measured, detects the amplitude of each of the analyzed frequency band components, and calculates an amplitude probability per unit time for the detected amplitude of each of the frequency band components whenever the unit time has elapsed. The test device includes: a test signal generating unit 41 that generates a test signal corresponding to a center frequency of the signal to be measured in order to test an operating state of the APD measuring device; and a control unit 42 that variably controls the amplitude level of the test signal in a dynamic range of the APD measuring device at random. The APD measuring device outputs, as the test result indicating the operating state of the APD measuring device, a PDF histogram which is created on the basis of the count value of the peak value of the amplitude of the test signal with a variation in the amplitude level and a time capture rate which is calculated on the basis of a difference between reference APD data and APD data obtained by the test signal.

According to a second aspect of the invention, in the device for testing an APD measuring device according to the first aspect, the control unit 42 may variably control a center frequency of the test signal according to the center frequency of the signal to be measured by the APD measuring device.

According to a third aspect of the invention, in the device for testing an APD measuring device according to the first aspect, the control unit 42 may arrange a series of the test signals in an order in which the test signals are generated which corresponds to a PN-sequence random number to create a PDF histogram corresponding to the peak value of the amplitude.

According to a fourth aspect of the invention, in the device for testing an APD measuring device according to any one of the first to third aspects, the control unit 42 may include a determining unit 42a that determines whether the APD measuring device 1 is operating normally on both an amplitude axis and a time axis when the PDF histogram has a uniform distribution and the time capture rate is within a predetermined permissible value range.

According to a fifth aspect of the invention, there is a provided a method of testing an APD measuring device 1 that analyzes frequency band components of a signal to be measured, detects the amplitude of each of the analyzed frequency band components, and calculates an amplitude probability per unit time for the detected amplitude of each of the frequency band components whenever the unit time has elapsed. The test method includes: a step of variably controlling the amplitude level of a test signal corresponding to a center frequency of the signal to be measured in a dynamic range of the APD measuring device at random; a step of creating a PDF histogram on the basis of the count value of the peak value of the amplitude of the test signal with a variation in the amplitude level; and a step of calculating a time capture rate on the basis of a difference between reference APD data and APD data obtained by the test signal.

According to a sixth aspect of the invention, the method of testing an APD measuring device according to the fifth aspect may further include a step of variably controlling a center frequency of the test signal according to the center frequency of the signal to be measured.

Advantage of the Invention

According to the test device and the test method of the invention, it is possible to accurately test the operating state of the APD measuring device in both the amplitude axis direction and the time axis direction with a very simple structure and method.

When the center frequency of the test signal is variably controlled according to the center frequency of the signal to be measured, it is possible to respond to a multi-channel frequency as well as a single channel as in the test method according to the related art.

When a series of test signals is arranged in the order in which the test signals are generated which corresponds to a PN-sequence random number to create a PDF distribution corresponding to the peak value of the amplitude, the test result is obtained by a method with a high test performance and it is possible to accurately test the operating state of the APD measuring device in both the amplitude axis direction and the time axis direction.

The above-mentioned structure includes means which determines that the APD measuring device is operating normally on both the amplitude axis and the time axis when the PDF histogram (the level of APD data) has a uniform distribution and the time capture rate is within a predetermined permissible value range. According to this structure, it is possible to automatically perform a series of processes from a process of testing the operating state of the APD measuring device to a process of determining the operating state of the APD measuring device.

BEST MODE FOR CARRYING OUT THE INVENTION

Hereinafter, exemplary embodiments of the invention will be described in detail with reference to the accompanying drawings. However, the invention is not limited to the embodiments, but all other embodiments, examples, and techniques which are based on the embodiments and are feasible for those skilled in the art are included in the scope of the invention.

Figure 1:
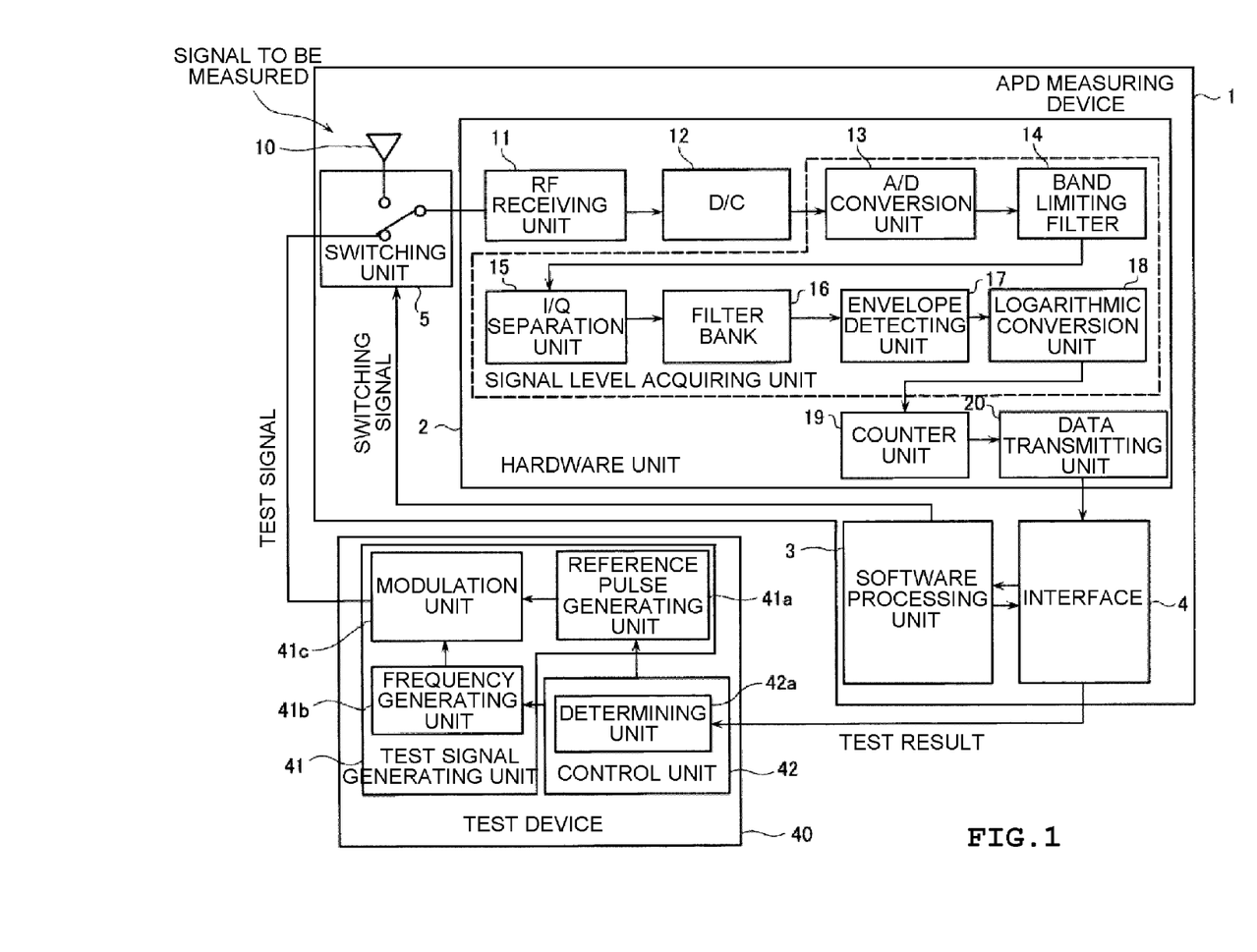
FIG. 1 is a block diagram illustrating a device for testing an APD measuring device according to an embodiment of the invention.
Figure 2:
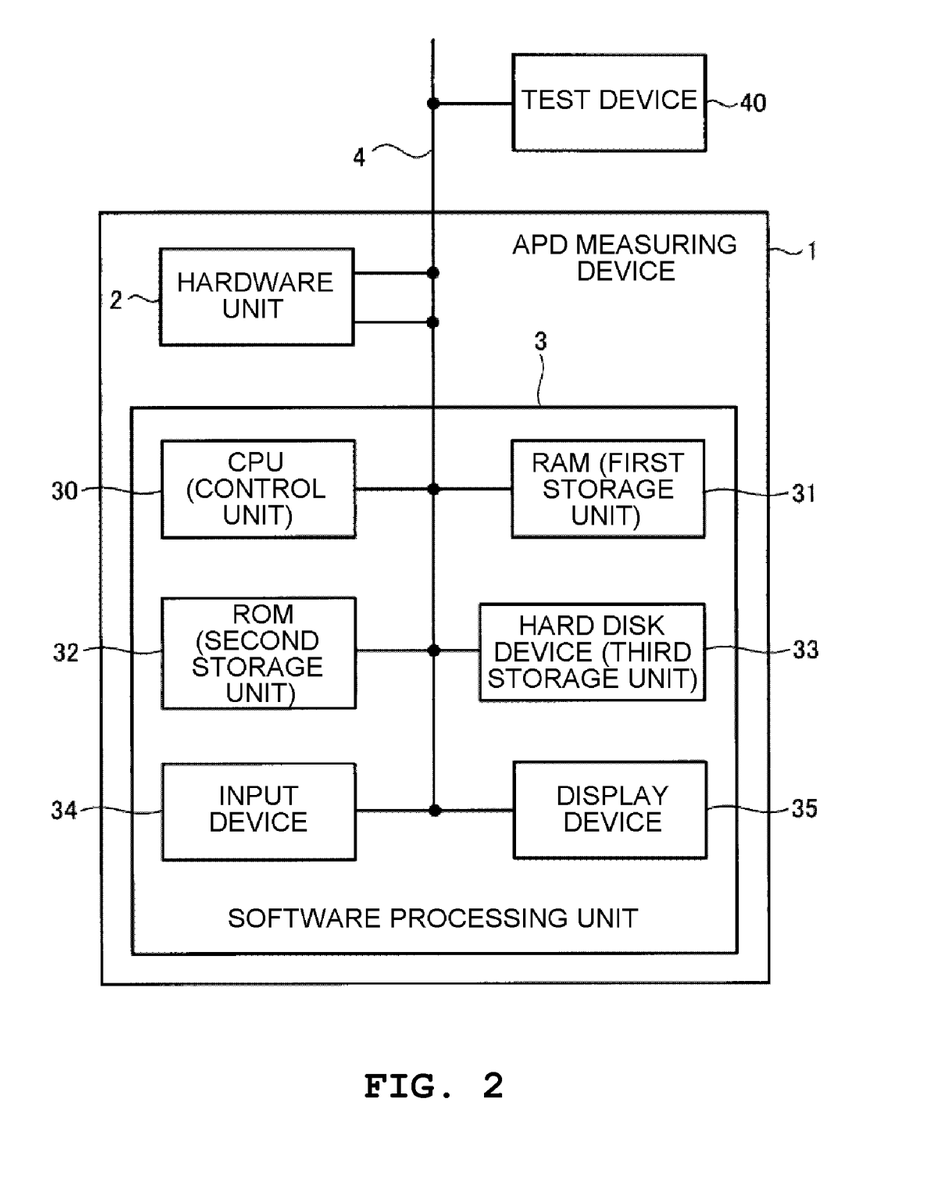
FIG. 2 is a block diagram illustrating the structure of a software processing unit of the APD measuring device shown in FIG. 1.
Figure 3:
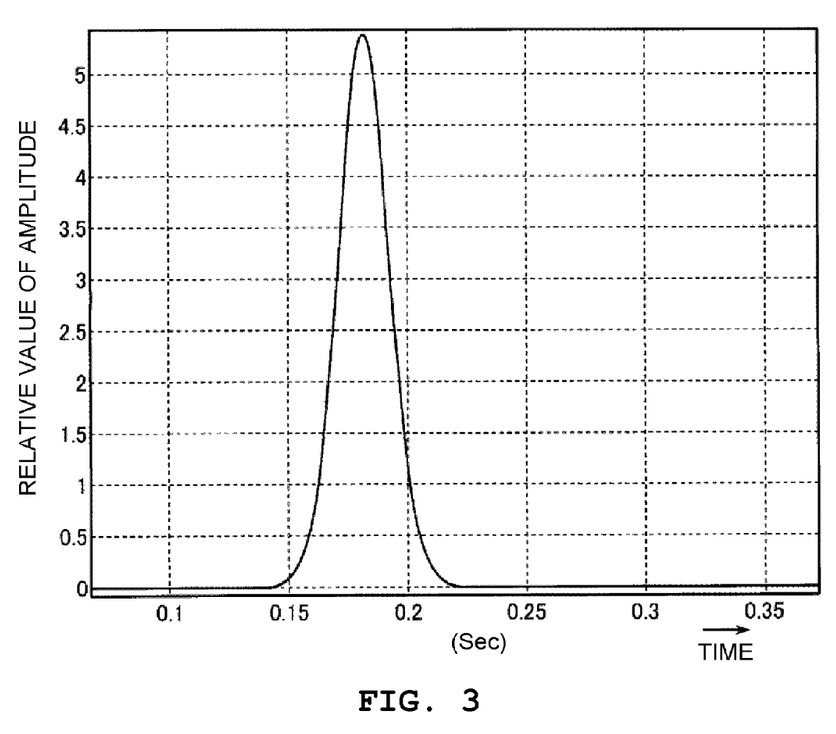
FIG. 3 is a diagram illustrating a Gaussian pulse waveform used by the test device according to the invention.
Figure 4:
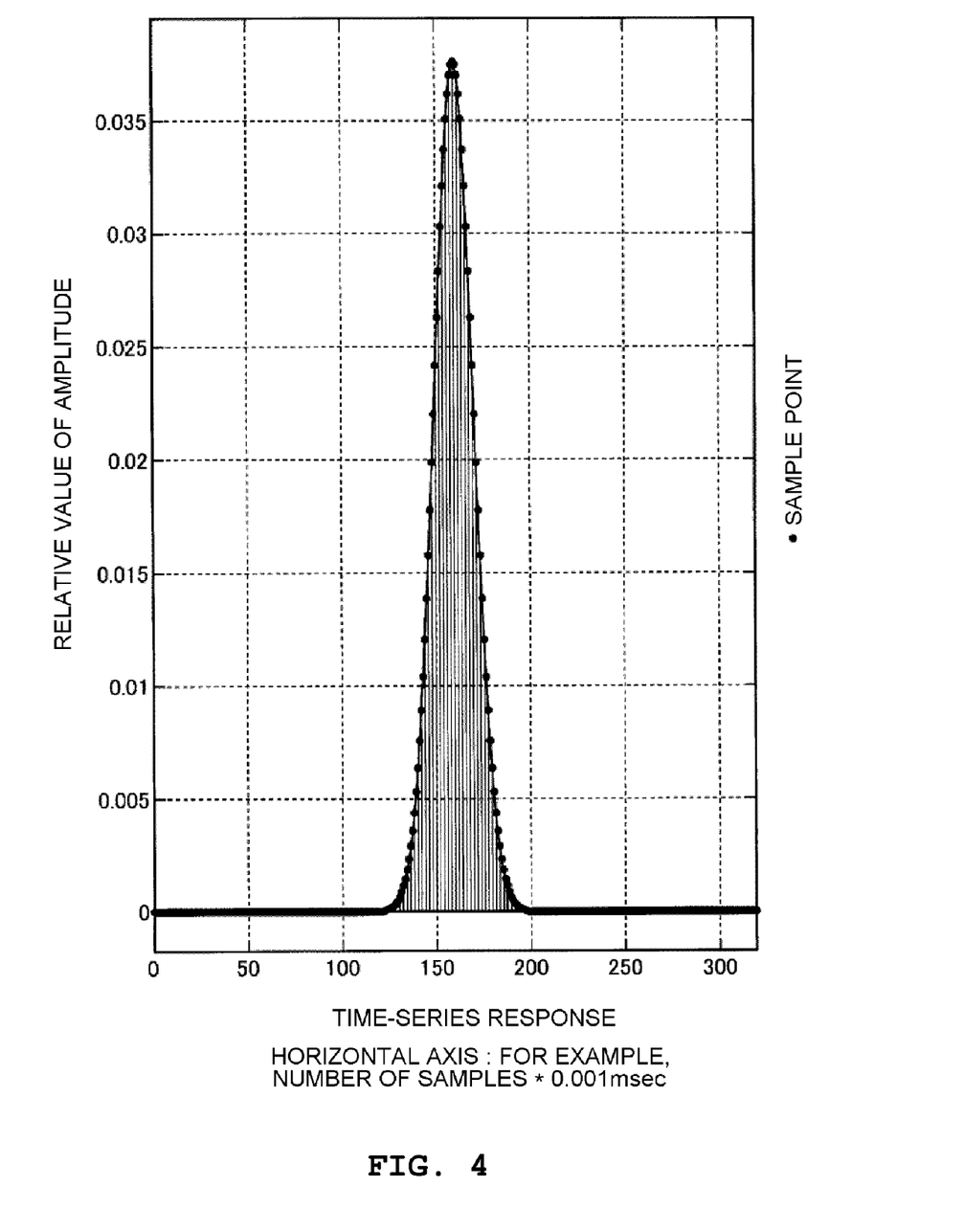
FIG. 4 is a time response diagram illustrating the Gaussian pulse waveform used by the test device according to the invention to test the APD measuring device after a Gaussian filtering process in a filter bank.
Figure 5:
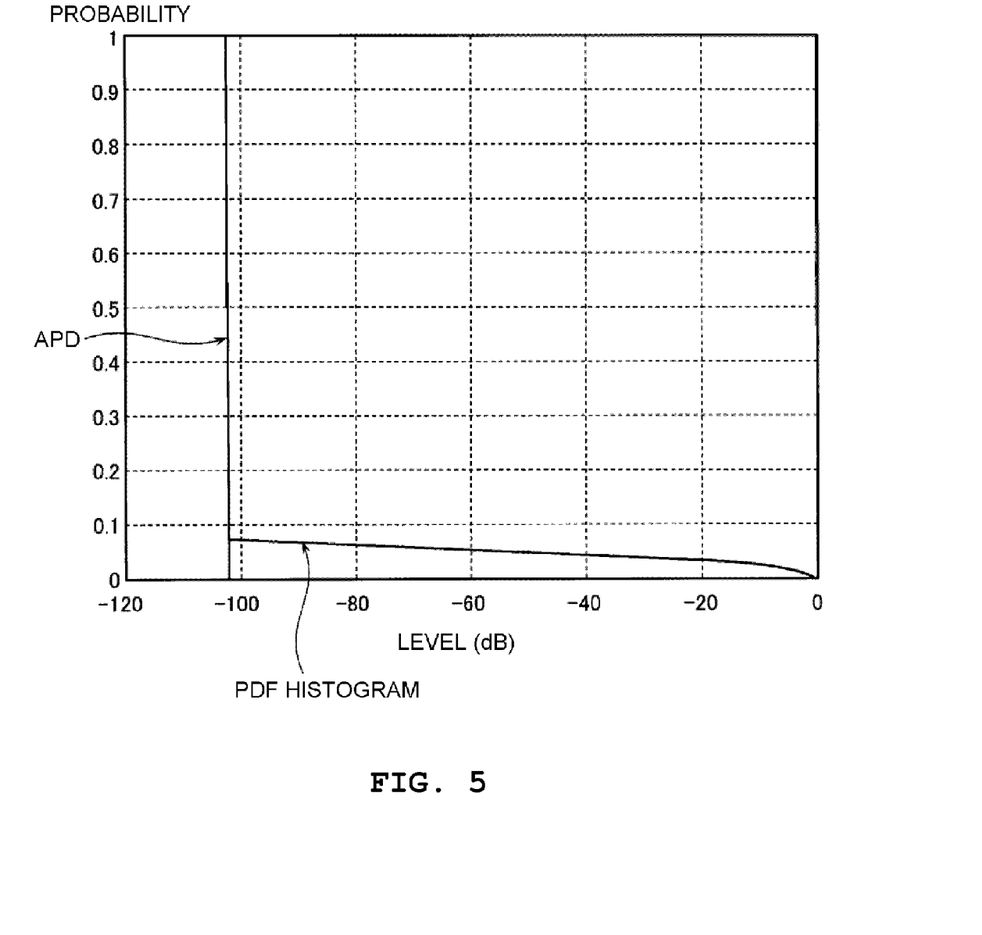
FIG. 5 is a diagram illustrating an example of an APD and a histogram when the test device according to the invention tests the APD measuring device.

FIG. 1 is a block diagram illustrating a device for testing an APD measuring device according to an embodiment of the invention. FIG. 2 is a block diagram illustrating the structure of a software processing unit of the APD measuring device shown in FIG. 1. FIG. 3 is a diagram illustrating a Gaussian pulse waveform used in the test device according to the invention. FIG. 4 is a time response diagram illustrating the Gaussian pulse waveform used by the test device according to the invention to test the APD measuring device after a Gaussian filtering process in a filter bank. FIG. 5 is a diagram illustrating an example of APD and a histogram when the test device according to the invention tests the APD measuring device.

First, the structure of the APD measuring device, which is a test target, will be described with reference to FIGS. 1 and 2.

The APD measuring device to be tested by the test device and a test method according to the invention measures, for example, an external radio wave (interference) which is received outside as a signal to be measured, analyzes frequency band components of the signal to be measured, detects the amplitude of each of the analyzed frequency band components, and calculates an amplitude probability per unit time for the amplitude of each of the detected frequency band components whenever the unit time has elapsed, thereby measuring the APD.

In this embodiment, as shown in FIG. 1, the APD measuring device 1 includes a hardware unit 2 including various kinds of hardware components, a software processing unit 3 that processes software, an interface 4 for transmitting data from the hardware unit 2 to the software processing unit 3 or from the software processing unit 3 to a test device 40, which will be described below, and a switching unit 5.

The hardware unit 2 includes an RF receiving unit 11 that receives an RF (Radio Frequency) signal through an antenna 10, a down-converter 12 (hereinafter, simply referred to as a "D/C") that down-converts the RF signal into a baseband signal, an A/D conversion unit 13 that converts the baseband signal into a digital signal, a band limiting filter 14 that limits the band of the digital signal in the band to be measured, an I/Q separation unit 15 that separates the band-limited signal into an I component and a Q component, a filter bank 16 that extracts each frequency band component predetermined as a measurement target, an envelope detecting unit 17 that detects an envelope for each frequency band component, and a logarithmic conversion unit 18 that converts the detection result of the envelope into a logarithm.

The filter bank 16 includes bandpass filters of a plurality of channels corresponding to the I component and the Q component of each frequency band component to be measured. The bandpass filters of a plurality of channels are configured such that the frequency bands of adjacent filters partially overlap each other and the center frequencies thereof are shifted by a predetermined frequency. The envelope detecting unit 17 includes a plurality of envelope detection circuits corresponding to each frequency band component to be measured and each of the envelope detection circuits performs squared detection on the basis of the I component and the Q component of the corresponding frequency band component, thereby calculating the signal level of each frequency band component.

The logarithmic conversion unit 18 includes a plurality of logarithmic conversion circuits corresponding to each envelope detection circuit and performs logarithmic conversion on the signal level of each frequency band component in the unit of dB. That is, the logarithmic conversion unit 18 divides the signal level according to the frequency band component to be measured and resolution when the signal level is quantized for each predetermined level (for example, a dynamic range of 100 dB is divided into 1000 parts at an interval of 0.1 dB).

The A/D conversion unit 13, the band limiting filter 14, the I/Q separation unit 15, the filter bank 16, the envelope detecting unit 17, and the logarithmic conversion unit 18 according to this embodiment form a signal level acquiring unit according to the invention.

The counter unit 19 includes a plurality of counters corresponding to the frequency band components to be measured and the resolution when the signal level is quantized and accumulates the frequency of appearance of the logarithm-converted signal level of each frequency band component. For example, the counter unit 19 includes 1000×N counters when the number of frequency band components to be measured is N, the dynamic range is 100 dB, and a signal history is accumulated at an interval of 0.1 dB.

The data transmitting unit 20 includes a buffer that transmits the value of each of the counters forming the counter unit 19 to the software processing unit 3 through the interface 4 at a predetermined time interval T (for example, an interval of 1 second). Each of the counters forming the counter unit 19 automatically sets the count value to 0 when the transmission of the count value to the data transmitting unit 20 at the time interval T ends.

As shown in FIG. 2, the software processing unit 3 includes a CPU 30 serving as a control unit, a RAM 31 serving as a first storage unit, a ROM 32 serving as a second storage unit, a hard disk device 33 serving as a third storage unit, an input device 34, such as a keyboard device or a pointing device, and a display device 35, such as a liquid crystal display, which are connected to a bus forming the interface 4. The hard disk device 33 may be a storage device having the function of a non-volatile memory.

The RAM 31 or the hard disk device 33 stores reference APD data (reference APD curve) which is referred to when the test is performed on the time axis, which will be described. The reference APD data is calculated in advance as an ideal APD value by a modulation signal obtained by modulating a frequency signal (sine wave) with the center frequency of each channel of the plurality of bandpass filters forming the filter bank 16 with a Gaussian pulse waveform.

The ROM 32 and the hard disk device 33 store programs for implementing the function of the software processing unit 3. That is, the CPU 30 executes the programs stored in the ROM 32 and the hard disk device 33 using the RAM 31 as a work area, thereby implementing the function of the software processing unit 3.

The CPU 30 controls the switching of the switching unit 5 according to the mode (the measurement mode or the test mode) which is selected and input from the input device 34. That is, when the measurement mode is selected and input from the input device 34, the CPU 30 controls the switching of the switching unit 5 such that the antenna 10 and the RF receiving unit 11 are connected to each other. When the test mode is selected and input from the input device 34, the CPU 30 controls the switching of the switching unit 5 such that the test device 40 and the RF receiving unit 11 are connected to each other.

In addition, the CPU 30 stores the count values of the counters forming the counter unit 19 which are transmitted from the data transmitting unit 20 in the hard disk device 33. Then, the CPU 30 calculates APD on the basis of the count value of each counter stored in the hard disk device 33 and displays the calculated APD on the display device 35. The display device 35 displays the test result (the test result in the amplitude axis direction and the test result in the time axis direction) indicating whether the APD measuring device 1 is operating normally on the basis of the test signal from the test device 40, which will be described below.

In the APD measuring device 1 having the above-mentioned structure, when the measurement mode for measuring a signal, which is a measurement target, is selected and input from the input device 34, the switching of the switching unit 5 is controlled such that the antenna 10 and the RF receiving unit 11 are connected to each other. When the measurement of the APD starts in response to an instruction input from the input device 34, the RF receiving unit 11 receives the signal (RF signal) to be measured through the antenna 10 and the D/C 12, the A/D conversion unit 13, the band limiting filter 14, the I/Q separation unit 15, the filter bank 16, the envelope detecting unit 17, and the logarithmic conversion unit 18 acquire the signal level of each frequency band component in the signal (RF signal) to be measured.

The value of the acquired signal level of each frequency band component in the signal to be measured is transmitted from the hardware unit 2 to the software processing unit 3 through the interface 4 and is stored in the hard disk device 33 for each frequency band component.

In the software processing unit 3, the CPU 30 calculates APD, the display of data by the display device 35 is updated, and the calculation result of the APD is stored in the hard disk device 33 for each frequency band component.

Next, the test device 40 for testing the APD measuring device 1 having the above-mentioned structure will be described.

The output side of the test device 40 is connected to the switching unit 5 and the input side thereof is connected to the software processing unit 3 through the interface 4 in the APD measuring device 1, which is a test target. As shown in FIG. 1, the test device 40 has a schematic structure including a test signal generator 41 and a control unit 42.

When the test mode is selected and input from the input device 34, the switching of the switching unit 5 is controlled by the switching signal from the CPU 30 of the software processing unit 3 such that the RF receiving unit 11 and the test signal generator 41 are connected to each other.

The test signal generator 41 generates a test signal for testing whether the APD measuring device 1 is operating normally on the amplitude axis and the time axis and includes a reference pulse generator 41a, a frequency generator 41b, and a modulation unit 41c.

The reference pulse generator 41a generates the Gaussian pulse waveform of the baseband signal as shown in FIG. 3 as a reference pulse.

The frequency generator 41b generates a frequency signal (sine wave signal) corresponding to the center frequency (frequency to be tested in the frequency range which can be received by the APD measuring device 1) of a received signal (signal to be measured) to be measured by the APD measuring device 1. In addition, when the bandpass filter of one channel is selected from the filter bank 16, the frequency generator 41b generates a frequency signal (sine wave) so as to vary depending on the center frequency of the channel under the control of the control unit 42, in order to respond to the measurement of a multi-channel APD.

The modulation unit 41c pulse-modulates the frequency signal (sine wave) generated by the frequency generator 41b with the Gaussian pulse waveform generated by the reference pulse generator 41a and outputs the pulse-modulated signal as the test signal. The bandpass filter of one channel is selected from the filter bank 16 according to the center frequency of the received signal (signal to be measured) to be measured by the APD measuring device 1 and the test signal varies depending on the center frequency of the selected channel. On the sample time axis, the form of frequency characteristics is enlarged or reduced from the properties of Fourier transform by the value of the time interval between samples.

In this embodiment, the signal obtained by modulating the frequency signal (sine wave) generated by the frequency generator 41b with the Gaussian pulse waveform generated by the reference pulse generator 41a is used as the test signal. However, a test signal corresponding to the pulse shape of the APD measuring device 1, which is a test target, may be used. In general, it is preferable to use a constant Gaussian pulse waveform in a time-shaped pulse and a frequency-shaped pulse. However, when other waveforms are used as the test signal, it is necessary to consider the shape of a temporal signal, paying attention to the frequency shape. As a method of considering the shape of the temporal signal, a temporal signal capable of exciting the response of the filter (the band limiting filter 14 and the filter bank 16) is selected since APD measurement detects the behavior of the temporal signal.

FIG. 3 shows a time response to the Gaussian pulse waveform input from the modulation unit 41c to the APD measuring device 1. FIG. 5 shows a PDF histogram when a frequency time response to the Gaussian pulse waveform is input to the counter unit 19 of the APD measuring device 1. In FIG. 5, the PDF histogram is accumulated to obtain the APD. In this case, the sampling time that is ten times longer than the frequency band of the filter bank 16 is used as a capture time interval.

The control unit 42 variably controls the amplitude level (corresponding to the amplitude level of the test signal) of the reference pulse generated by the reference pulse generator 41a with a predetermined number of resolution steps in the level amplitude axis direction at random in the dynamic range of the APD measuring device 1.

The control unit 42 selects the bandpass filter of one channel from the filter bank 16 according to the center frequency of the received signal (signal to be measured) to be measured by the APD measuring device 1, performs switching control, and controls the frequency generator 41b so as to generate a frequency signal (sine wave) corresponding to the center frequency of the selected channel.

In addition, the control unit 42 includes a determining unit 42a that determines whether the APD measuring device 1 is operating normally on the basis of the test result when the test signal is input to the APD measuring device 1. When the test signal is input to the APD measuring device 1, the determining unit 42a determines whether the APD measuring device 1 is operating normally on the basis of the test result input from the software processing unit 3 through the interface 4. That is, the determining unit 42a determines that the APD measuring device 1 is operating normally when the peak value of the amplitude of the test signal is equal to the level result value of the counter unit 19 as the test result on the amplitude level axis and when a time capture rate for each of the center frequencies of each channel at each amplitude level is within a predetermined permissible value range as the test result on the time axis.

Next, a method of testing the APD measuring device 1 using the test device 40 having the above-mentioned structure will be described. When the test device 40 is used to test the APD measuring device 1, the test mode is selected and input from the input device 34. Then, the CPU 30 of the software processing unit 3 controls the switching of the switching unit 5 such that the RF receiving unit 11 and the test signal generator 41 are connected to each other. Then, the test signal is input from the test signal generator 41 of the test device 40 to the RF receiving unit 11 of the APD measuring device 1. The modulation unit 41c pulse-modulates the frequency signal (sine wave) generated by the frequency generator 41b using the Gaussian pulse waveform on the time axis generated by the reference pulse generator 41a, thereby obtaining the test signal.

(Test on Amplitude Axis)

The test of the APD measuring device 1 on the amplitude axis is testing the APD level and changes the amplitude at random in the level amplitude axis direction while oscillating all the bands of the filters, which is a key point of APD measurement. That is, the control unit 42 changes the center frequency of the frequency signal (sine wave) generated by the frequency generator 41b depending on the center frequency of one channel of the bandpass filter selected from the filter bank 16, changes the amplitude level of the Gaussian pulse waveform (reference pulse) generated by the reference pulse generator 41a at random in the dynamic range of the APD measuring device 1, and inputs the test signal obtained by pulse-modulating the frequency signal with the Gaussian pulse waveform to the APD measuring device 1. In this way, it is possible to obtain a response similar to the actual response and thus obtain and verify the measurement result in the amplitude axis direction in the mode close to the measurement operation.

Specifically, the counter unit 19 counts the peak value of the amplitude when the test signal in which the amplitude level and the center frequency are variable (the center frequency is fixed in the case of one channel) is input to the APD measuring device 1 and the software processing unit 3 creates the PDF histogram shown in FIG. 5. The created PDF histogram is transmitted as the test result to the test device 40 through the interface 4. The determining unit 42a of the control unit 42 in the test device 40 compares the level result value of the counter unit 19 with the peak value of the amplitude of the test signal using the PDF histogram from the software processing unit 3. When all the PDF histograms (the levels of APD data) in which the two values are equal to each other are uniformly distributed, the determining unit 42a determines that the APD measuring device 1 is operating normally on the amplitude axis.

(Test on Time Axis)

After the APD of the Gaussian pulse waveform on the time axis is measured, the output of the filter bank 16 is the pulse of a Gaussian-shaped time signal corresponding to the band. FIG. 4 shows a Gaussian output waveform in this case. At the sampling time that is ten times longer than the frequency band of the filter bank 16, for example, the shape of an APD curve obtained by the collection and calculation of the sample points shown in FIG. 4 is uniquely determined when the amplitude level of the test signal on the amplitude axis is determined with respect to the time axis direction of the pulse. This property makes it possible to completely test the time capture rate using the shape of the APD curve.

Specifically, the APD data (APD curve) calculated by the software processing unit 3 when the test signal in which the amplitude level and the center frequency (which is fixed in the case of one channel) are variable is input to the APD measuring device 1 is compared with the reference APD data (reference APD curve) which is stored in advance and the time capture rate is calculated on the basis of the difference therebetween.

Next, a method of calculating the time capture rate will be described. It is assumed that the measured level of the APD data is Lei and the level of the reference APD data is Lsi. The securing of the time capture rate means that a predetermined signal level is observed at a predetermined time. The sampling measurement time depends on the time of the APD measuring device. The time is represented by i. For example, when the sample point shown in FIG. 4 indicates Lei (Lsi in the case of reference data) and the timing of the sampling time indicating the level Lei at the sampling measurement time i is the same in the measured APD and the reference APD, the difference therebetween can be calculated from (Lei−Lsi)/Lsi [i=1, . . . , N]. The following (1) and (2) are examples of the calculated time capture rate.

(1) A fluctuation range from a predetermined level is considered, and the time capture rate is calculated on the basis of a predetermined standard width value under the condition that If |(Lei−Lsi)/Lsi|≥ standard width value: NGi; if not: Gi, using the following Expression 1.

$$\sum_i GiG * 100 \Big/ \sum_i (NGi + Gi)[\%] \qquad \text{[Expression 1]}$$

(2) As the observation result, evaluation may be made from the degree of approximation of the APD curve (a level probability curve). Probability up to an important level L0 is calculated and the difference between the probability values is calculated.

A value calculated by [1−{APDe(L0)−APDs(L0)}/APDs(L0)]*100% on the basis of the probability of APD(L0)=∫p(L)dL(+∞L0) is the time capture rate.

The time capture rate calculated in this way is transmitted as the test result to the test device 40 through the interface 4. The determining unit 42a of the control unit 42 in the test device 40 determines that the APD measuring device 1 is operating normally on the time axis when the time capture rate from the software processing unit 3 is within a predetermined permissible value range and indicates the time capture rate with the determined distribution.

As such, the invention relates to a random test method for the frequency and time by the generation of pulses. A hardware unit for implementing the functions of the circuits forming the APD measuring device 1 is fully operated. When the PDF histograms (the level of APD data) are uniformly distributed in the amplitude axis direction and the time capture rate with the determined distribution is represented in the time axis direction as the processing result, it is automatically determined that the APD measuring device 1 is operating normally on both the amplitude axis and the time axis. In this way, it is possible to accurately test the operating state of the APD measuring device 1 in both the amplitude axis direction and the time axis direction using a very simple method and thus determine the operating state of the APD measuring device 1 with ease. In addition, it is possible to automatically perform a series of processes from a test process to a determination process for the operating state of the APD measuring device 1 in both the amplitude axis direction and the time axis direction. Further, it is possible to respond to a multi-channel frequency as well as a single channel as in the test method according to the related art.

The above-mentioned test method considers components of a multi-channel APD measuring method and can test whether the linearity of the measurement of the APD measuring device 1 is maintained using a general-purpose APD curve. When the linearity is not maintained, it is difficult to obtain an accurate amplitude probability distribution. Therefore, it is possible to strictly test the APD measuring device 1.

In the multi-channel test, the control unit 42 selectively changes the bandpass filters forming the filter bank 16, shifts the center frequency of the test signal input to the APD measuring device 1, and designates each channel. The test signal input to the APD measuring device 1 may be obtained by pulse-modulating the frequency signals (sine waves) of a plurality of channels from the frequency generator 41b with the Gaussian pulse waveform generated from the reference pulse generator 41a. In this case, a test signal obtained by combining multi-channel signals may be input to the APD measuring device 1. In this case, it is possible to simultaneously test multiple channels.

In the above-described embodiment, the test results on the amplitude axis and the time axis obtained by the software processing unit 3 are output from the software processing unit 3 to the test device 40 through the interface 4, but the invention is not limited thereto. The test results may be displayed on the display device 35. In this case, the measurer can view the test results displayed on the display device 35 and determine whether the APD measuring device 1 is operating normally. The determination result may be displayed on the display device 35 according to the test results. In this case, the measurer can instantaneously determine whether the APD measuring device 1 is operating normally from the content displayed on the display device 35. When there is an operation error, the measurer can surmise the cause of the operation error from the test result.

The test signal input to the APD measuring device 1, which is a test target is not limited to the signal obtained by pulse-modulating the frequency signal (sine wave) with the Gaussian pulse waveform, but the levels corresponding to the number of steps in the resolution of the amplitude value of an initial time waveform may be generated at random as the test signal. For example, a PN pattern, which is a pseudorandom pattern that can be generated by a known pulse pattern generator, may be used.

In this case, similarly to the peak value of the amplitude in the APD diagram (FIG. 5) when measurement is performed once, the order in which the test signals are generated according to the number of steps in the resolution of the amplitude value of an initial time waveform corresponds to a PN-sequence random number and a series of the test signals is arranged in the order in which the test signals are generated, thereby creating a PDF histogram corresponding to the peak value of the amplitude. When the created PDF histogram is normal, it is a straight line. According to this structure, the test result by a method with a high test performance is obtained and it is possible to accurately test the operating state of the APD measuring device 1 in the amplitude axis direction and the time axis direction.

In the above-described embodiment, the test device 40 is provided separately from the APD measuring device 1, but the invention is not limited thereto. For example, the CPU 30 of the APD measuring device 1 may have the function of the determining unit 42a of the control unit 42 in the test device 40. In addition, the test device 40 may be incorporated as a unit into the APD measuring device 1. In this case, the CPU 30 of the APD measuring device 1 may also have the function of the control unit 42 of the test device 40.

DESCRIPTION OF REFERENCE NUMERALS AND SIGNS

1: APD MEASURING DEVICE (TEST TARGET)
2: HARDWARE UNIT
3: SOFTWARE PROCESSING UNIT
4: INTERFACE
5: SWITCHING UNIT
10: ANTENNA
11: RF RECEIVING UNIT
12: D/C (DOWN CONVERTER)
13: A/D CONVERSION UNIT
14: BAND LIMITING FILTER
15: I/Q SEPARATION UNIT
16: FILTER BANK
17: ENVELOPE DETECTING UNIT
18: LOGARITHMIC CONVERSION UNIT
19: COUNTER UNIT
20: DATA TRANSMITTING UNIT
30: CPU (CONTROL UNIT)
31: RAM (FIRST STORAGE UNIT)
32: ROM (SECOND STORAGE UNIT)
33: HARD DISK DEVICE (THIRD STORAGE UNIT)
34: INPUT DEVICE
35: DISPLAY DEVICE
40: TEST DEVICE
41: TEST SIGNAL GENERATOR
41a: REFERENCE PULSE GENERATOR
41b: FREQUENCY GENERATOR
41c: MODULATION UNIT
42: CONTROL UNIT
42a: DETERMINING UNIT

The invention claimed is:

1. A device for testing an operating state of an APD (Amplitude Probability Distribution) measuring device that analyzes a frequency band component included in a signal to be measured, detects the amplitude of the analyzed frequency band component, and calculates an amplitude probability, which is the probability of the detected amplitude of the frequency band component exceeding a predetermined threshold value for a unit time, whenever the unit time has elapsed, comprising:
    a test signal generator that generates a test signal corresponding to the vicinity of a center frequency of the signal to be measured;
    a control unit that variably controls the amplitude of the test signal in a predetermined level range at random; and
    a determining unit that determines whether the APD measuring device is operating normally on the basis of the test signal as input to the APD measuring device, a time capture rate indicating that a predetermined amplitude for the unit time and a PDF (Probability Density Function) histogram indicating the distribution of the amplitude is obtained from the APD measuring device.

2. The device for testing an APD measuring device according to claim 1,
    wherein the time capture rate is calculated on the basis of a difference between reference APD data and APD data obtained from the APD measuring device when the test signal is input to the APD measuring device instead of the signal to be measured, and
    the reference APD data is obtained on the basis of a modulated signal obtained by modulating a sine wave corresponding to the vicinity of the center frequency of the signal to be measured using a Gaussian pulse waveform.

3. The device for testing an APD measuring device according to claim 1,
    wherein, when the PDF histogram has a uniform distribution and the time capture rate is within a predetermined permissible value range, the determining unit determines that the APD measuring device is operating normally on both an amplitude axis and a time axis.

4. The device for testing an APD measuring device according to claim 1,
    wherein the APD measuring device divides the frequency band component of the signal to be measured into a plurality of frequency band components, analyzes the plurality of frequency band components, detects the amplitude of each of the analyzed frequency band components, and calculates the amplitude probability per unit time for the detected amplitude of each of the frequency band components whenever the unit time has elapsed, the test signal generator generates the test signal corresponding to the vicinity of the center frequency of the signal to be measured, and the control unit variably controls the center frequency of the signal to be measured by the APD measuring device.

5. The device for testing an APD measuring device according to claim 1, wherein the control unit arranges a series of the test signals in an order in which the test signals are generated which corresponds to a PN-sequence random number, thereby generating the PDF histogram corresponding to the peak value of the amplitude.

6. An APD measuring device comprising:

an RF (Radio Frequency) receiving unit that receives a signal to be measured;

an A/D conversion unit that converts the received signal to be measured into a digital signal;

a band limiting filter that limits a band of the digital signal in a measurement target band; and an envelope detecting unit that detects an envelope of the band-limited digital signal;

an APD (Amplitude Probability Distribution) measuring unit that analyzes a frequency band component included in the signal to be measured, detects the amplitude of the analyzed frequency band component, and calculates an amplitude probability, which is the probability of the detected amplitude of the frequency band component exceeding a predetermined threshold value for a unit time, whenever the unit time has elapsed;

a test signal generator that generates a test signal corresponding to the vicinity of a center frequency of the signal to be measured;

a control unit that variably controls the amplitude of the test signal in a predetermined level range at random;

a switching unit that inputs the signal to be measured and the test signal to the APD measuring unit while switching the signals; and a determining unit that determines whether the APD measuring unit is operating normally on the basis of, the test signal as input to the APD measuring device, a time capture rate indicating that a predetermined amplitude per unit time and a PDF (Probability Density Function) histogram indicating the distribution of the amplitude obtained from the APD measuring device.

7. The APD measuring device according to claim 6, wherein the time capture rate is calculated on the basis of a difference between reference APD data and APD data obtained from the APD measuring unit when the test signal is input to the APD measuring unit instead of the signal to be measured, and the reference APD data is obtained on the basis of a modulated signal obtained by modulating a sine wave corresponding to the vicinity of the center frequency of the signal to be measured using a Gaussian pulse waveform.

8. The APD measuring device according to claim 6, wherein, when the PDF histogram has a uniform distribution and the time capture rate is within a predetermined permissible value range, the determining unit determines that the APD measuring unit is operating normally on both an amplitude axis and a time axis.

9. The APD measuring device according to claim 6, wherein the APD measuring unit divides the frequency band component of the signal to be measured into a plurality of frequency band components, analyzes the plurality of frequency band components, detects the amplitude of each of the analyzed frequency band components, and calculates the amplitude probability per unit time for the detected amplitude of each of the frequency band components whenever the unit time has elapsed.

10. The APD measuring device according to claim 6, wherein the control unit arranges a series of the test signals in an order in which the test signals are generated which corresponds to a PN-sequence random number, thereby generating the PDF histogram corresponding to the peak value of the amplitude.

11. A test method of testing an operating state of an APD (Amplitude Probability Distribution) measuring device that analyzes a frequency band component included in a signal to be measured, detects the amplitude of the analyzed frequency band component, and calculates an amplitude probability, which is the probability of the detected amplitude of the frequency band component exceeding a predetermined threshold value for a unit time, whenever the unit time has elapsed, comprising:

a step of variably controlling the amplitude of a test signal corresponding to the vicinity of a center frequency of the signal to be measured in a predetermined level range at random;

a step of creating a PDF (Probability Density Function) histogram indicating the distribution of the amplitude which is obtained from the APD measuring device when the test signal is input to the APD measuring device;

a step of calculating a time capture rate indicating a predetermined amplitude per unit time; and a step of determining whether the APD measuring device is operating normally on the basis of the PDF histogram and the time capture rate.

12. The method of testing an APD measuring device according to claim 11, wherein the time capture rate is calculated on the basis of a difference between reference APD data and APD data obtained from the APD measuring device when the test signal is input to the APD measuring device instead of the signal to be measured, and the reference APD data is obtained on the basis of a modulated signal obtained by modulating a sine wave corresponding to the vicinity of the center frequency of the signal to be measured using a Gaussian pulse waveform.

13. The method of testing an APD measuring device according to claim 11, wherein, when the PDF histogram has a uniform distribution and the time capture rate is within a predetermined permissible value range, the step of determining whether the APD measuring device is operating normally determines that the APD measuring device is operating normally on both an amplitude axis and a time axis.

14. The method of testing an APD measuring device according to claim 11, wherein the APD measuring device divides the frequency band component of the signal to be measured into a plurality of frequency band components, analyzes the plurality of frequency band components, detects the amplitude of each of the analyzed frequency band components, and calculates the amplitude probability per unit time for the detected amplitude of each of the frequency band components whenever the unit time has elapsed, the test signal corresponding to the vicinity of the center frequency of the signal to be measured is generated, and the center frequency of the signal to be measured by the APD measuring device is variably controlled.

15. The method of testing an APD measuring device according to claim 11,
wherein a series of the test signals is arranged in an order in which the test signals are generated which corresponds to a PN-sequence random number, thereby generating the PDF histogram corresponding to the peak value of the amplitude.

* * * * *